United States Patent
Kalb et al.

(10) Patent No.: US 12,132,452 B2
(45) Date of Patent: Oct. 29, 2024

(54) APPARATUS AND METHODS FOR AMPLIFIER INPUT-OVERVOLTAGE PROTECTION WITH LOW LEAKAGE CURRENT

(71) Applicant: Analog Devices, Inc., Norwood, MA (US)

(72) Inventors: Arthur J. Kalb, Santa Clara, CA (US); Yoshinori Kusuda, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 339 days.

(21) Appl. No.: 16/946,090

(22) Filed: Jun. 5, 2020

(65) Prior Publication Data

US 2021/0384870 A1    Dec. 9, 2021

(51) Int. Cl.
*H03F 1/52*      (2006.01)
*H02H 3/20*      (2006.01)
*H02M 1/32*      (2007.01)

(52) U.S. Cl.
CPC .............. *H03F 1/52* (2013.01); *H02H 3/20* (2013.01); *H02M 1/32* (2013.01); *H03F 2200/441* (2013.01)

(58) Field of Classification Search
CPC ...... H03F 1/52; H03F 1/523; H03F 2200/258; H03F 2200/426; H03F 2200/441; H03F 2200/444; H03F 2203/45102; H03F 3/45; H03F 3/45071; H03F 3/45076; H03F 3/45179; H02H 3/20; H02M 1/32
See application file for complete search history.

(56) References Cited

U.S. PATENT DOCUMENTS

| | | | |
|---|---|---|---|
| 3,593,173 A | 7/1971 | Nercessian | |
| 4,044,313 A | 8/1977 | Wittlinger | |
| 4,264,872 A | 4/1981 | Suzuki | |

(Continued)

FOREIGN PATENT DOCUMENTS

| | | | | |
|---|---|---|---|---|
| CN | 105024658 B | * | 12/2017 | ............... H03F 1/52 |
| CN | 108880488 A | * | 11/2018 | ............. H03F 1/523 |

(Continued)

OTHER PUBLICATIONS

Analog Devices, Inc., AMP02, "High Accuracy Instrumentation Amplifer," Jan. 2003, in 12 pages.

(Continued)

*Primary Examiner* — Long Nguyen
(74) *Attorney, Agent, or Firm* — Knobbe, Martens, Olson & Bear, LLP

(57) ABSTRACT

Apparatus and methods for amplifier input-overvoltage protection with low leakage current are provided herein. In certain embodiments, amplifier input circuitry for an amplifier includes a pair of input terminals, a pair of input transistors each having a control input (for instance, a transistor gate), a pair of protection transistors each connected between one of the input terminals and the control input of a corresponding one of the input transistors, and a bidirectional clamp connected between the control inputs of the input transistors. Implementing the amplifier input circuitry in this manner provides a number of advantages including, but not limited to, robust protection against input overvoltage and low input-leakage current.

20 Claims, 11 Drawing Sheets

(56) References Cited

U.S. PATENT DOCUMENTS

| | | | |
|---|---|---|---|
| 5,742,463 A | 4/1998 | Harris | |
| 5,942,921 A | 8/1999 | Talaga, Jr. | |
| 6,459,556 B1 | 10/2002 | Taguchi | |
| 6,483,386 B1 | 11/2002 | Cress et al. | |
| 6,693,780 B2 | 2/2004 | Spehar et al. | |
| 6,914,485 B1 | 7/2005 | Carroll | |
| 7,339,402 B2 | 3/2008 | Alenin et al. | |
| 7,525,778 B2 | 4/2009 | Kitagawa | |
| 7,532,076 B2 | 5/2009 | Hanada et al. | |
| 8,258,868 B2 | 9/2012 | Marshall | |
| 8,462,477 B2 | 6/2013 | Modica et al. | |
| 9,276,531 B2 | 3/2016 | Gerstenhaber | |
| 9,559,640 B2 | 1/2017 | Youssef et al. | |
| 9,837,973 B2* | 12/2017 | Brantley | H03F 3/45376 |
| 2006/0103999 A1 | 5/2006 | Randazzo | |
| 2015/0028949 A1* | 1/2015 | Brantley | H03F 3/45376 330/253 |

FOREIGN PATENT DOCUMENTS

| | | |
|---|---|---|
| EP | 1 181 773 B1 | 8/2006 |
| EP | 2 544 367 A2 | 1/2013 |
| JP | 3791319 B2 | 6/2006 |
| JP | 2008/288900 A | 11/2008 |
| JP | 4508096 B2 | 7/2010 |
| JP | 5042499 B2 | 10/2012 |
| JP | 2018/056760 | 4/2018 |
| KR | 2000/0007447 U | 4/2000 |
| WO | WO 95/01667 A1 | 1/1995 |
| WO | WO 2019/208371 A1 | 10/2019 |

OTHER PUBLICATIONS

Analog Devices, Inc., OP-06 "High-Gain Instrumentation Operational Amplifier," Sep. 1996, in 5 pages.

D. Burton, "Op Amp Input Overvoltage Protection: Clamping vs. Integrated," Analog Dialogue, vol. 50, No. 05, p. 3, May 2016, in 3 pages.

E. Modica and M. Arkin, "Robust Amplifiers Provide Integrated Overvoltage Protection," Analog Dialogue, vol. 46, No. 02, p. 5, 2012, in 5 pages.

S. A. Wurcer and L. W. Counts, "A programmable instrumentation amplifier for 12-bit resolution systems," IEEE J. Solid-State Circuits, vol. 17, No. 6, pp. 1102-1111, Dec. 1982, in 10 pages.

* cited by examiner

APPARATUS AND METHODS FOR AMPLIFIER INPUT-OVERVOLTAGE PROTECTION WITH LOW LEAKAGE CURRENT

FIELD OF THE DISCLOSURE

Embodiments of the invention relate to electronic systems, and more particularly, to amplifiers.

BACKGROUND

Certain electronic devices employ amplifiers for amplifying and/or otherwise processing signals. When operating open loop, such amplifiers receive an input signal and generate an output signal having a gain in comparison to the input signal. Examples of amplifiers include, but are not limited to, operational amplifiers, transimpedance amplifiers, and transconductance amplifiers. Certain amplifiers are implemented in a multi-stage configuration to enhance gain and/or performance thereof.

SUMMARY OF THE DISCLOSURE

Apparatus and methods for amplifier input-overvoltage protection with low leakage current are provided herein. In certain embodiments, amplifier input circuitry for an amplifier includes a pair of input terminals, a pair of input transistors each having a control input (for instance, a transistor gate), a pair of protection transistors each connected between one of the input terminals and the control input of a corresponding one of the input transistors, and a bidirectional clamp connected between the control inputs of the input transistors. Implementing the amplifier input circuitry in this manner provides a number of advantages including, but not limited to, robust protection against input overvoltage and low input-leakage current.

In one aspect, an amplifier having input-overvoltage protection with low leakage current is provided. The amplifier includes a pair of input terminals configured to receive a differential input signal, wherein the pair of input terminals includes a first input terminal and a second input terminal. The amplifier further includes a differential pair of input transistors configured to amplify the differential input signal, wherein the differential pair of input transistors includes a first input transistor and a second input transistor. The amplifier further includes a first protection transistor in series between the first input terminal and a control input of the first input transistor, and a voltage clamp connected between the control input of the first input transistor and a control input of the second input transistor.

In another aspect, a method of amplifier input-overvoltage protection with low leakage current is provided. The method includes receiving a differential input signal between a first input terminal and a second input terminal of an amplifier. The method further includes amplifying the differential input signal using a differential pair of input transistors of the amplifier, the differential pair of input transistors including a first input transistor and a second input transistor. The method further includes protecting the differential pair of input transistors from overvoltage, including controlling an impedance between the first input terminal and a control input of the first input transistor using a first protection transistor, and limiting a voltage across the control input of the first input transistor and a control input of the second input transistor using a voltage clamp.

In another aspect, a multiplexed amplifier system is provided. The multiplexed amplifier system includes an amplifier, and a multiplexer configured to receive a plurality of input signals and to output a selected input signal. The amplifier includes a pair of input terminals including a first input terminal configured to receive the selected input signal and a second input terminal. The amplifier further includes a differential pair of input transistors including a first input transistor and a second input transistor. The amplifier further includes a first protection transistor in series between the first input terminal and a control input of the first input transistor, and a voltage clamp connected between the control input of the first input transistor and a control input of the second input transistor.

DETAILED DESCRIPTION OF EMBODIMENTS

Figure 1:
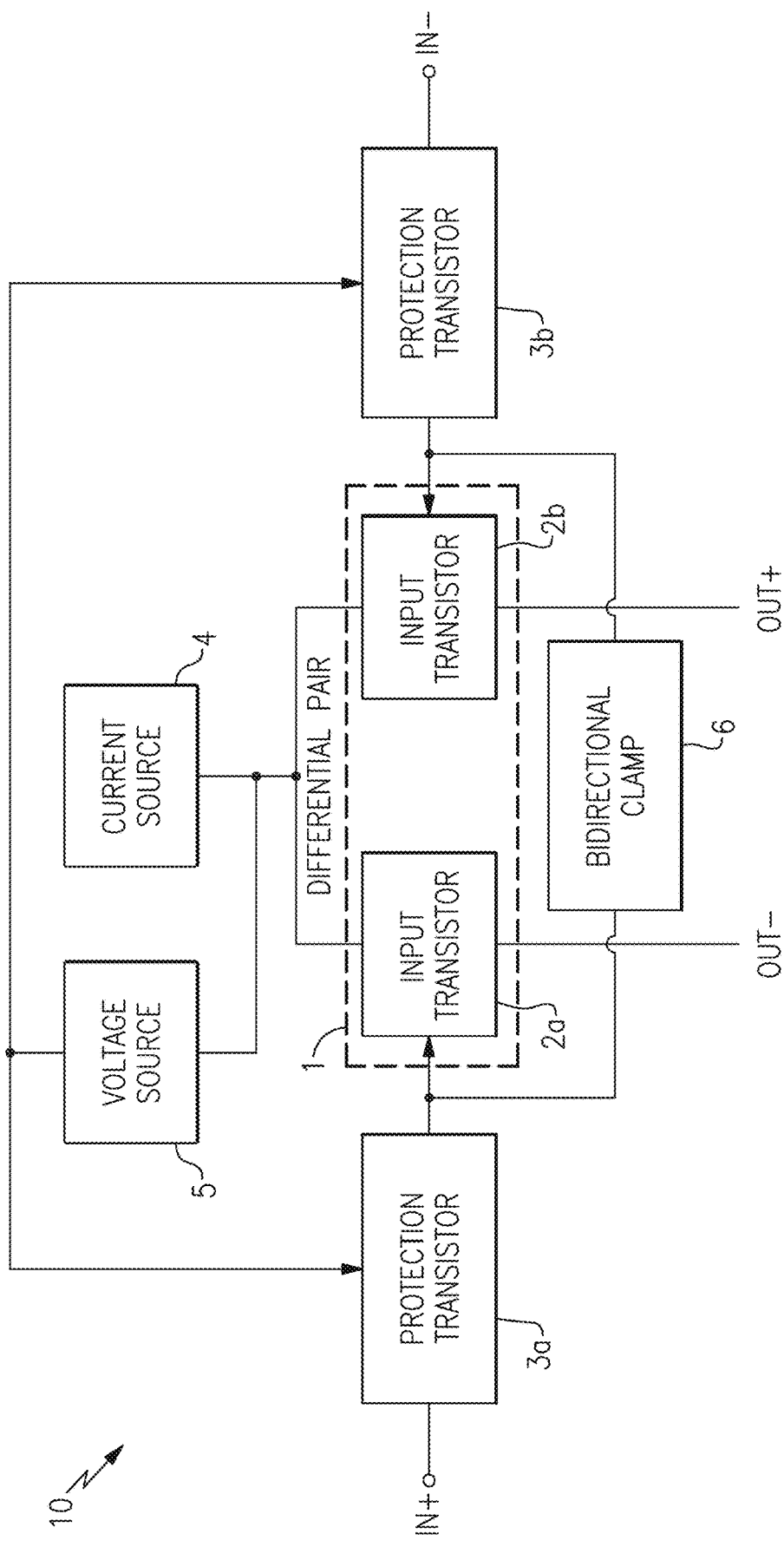
FIG. 1 is a schematic diagram of amplifier input circuitry according to one embodiment.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Apparatus and methods for amplifier input-overvoltage protection with low leakage current are provided herein. In certain embodiments, amplifier input circuitry for an amplifier includes a pair of input terminals, a pair of input transistors each having a control input (for instance, a transistor gate), a pair of protection transistors each connected between one of the input terminals and the control input of a corresponding one of the input transistors, and a bidirectional clamp connected between the control inputs of the input transistors.

Implementing the amplifier input circuitry in this manner provides a number of advantages including, but not limited to, robust protection against input overvoltage and low input-leakage current. Thus, a differential input of an amplifier is protected from damage when an excessive differential voltage is applied. Additionally, the leakage current under this fault condition is kept small.

Including both the bidirectional clamp and the protection transistors provides a number of advantages. For example, the protection transistors serve to enhance low-frequency and transient performance by limiting input currents that could otherwise cause perturbation or disturbances in a circuit's operation. Additionally, the bidirectional clamp provides a fail-safe if the protection transistors are not sufficient to fully protect the inputs.

Moreover, an amplifier implemented with the amplifier input circuitry herein operates robustly when connected with negative feedback. In contrast, when only the bidirectional clamp is included (when no pair of protection transistors is present), a large voltage difference between the amplifier's input terminals can result in a current flow between the input terminals through the bidirectional clamp, thereby causing a disturbance in the amplifier's feedback loop.

A primary application that is impacted by this scenario is an electronic system that utilizes an amplifier in a multiplexing (muxing) configuration. For instance, a non-inverting input terminal of the amplifier can be multiplexed to different input signals, and the amplifier's inverting terminal can be connected by feedback to the amplifier's output terminal and remain near a previous voltage for some duration after the input signal is changed. In such an electronic system, not only can a large voltage difference develop between the amplifier's input terminals when the input signal changes, but also a flow of transient input current can arise.

When only the bidirectional clamp is included (when no pair of protection transistors is present), a large charge flow (current) can occur from the non-inverting input terminal to the inverting input terminal, which causes a transient disturbance that can take considerable time to settle. The transient disturbance can lead to a degradation in accuracy and/or the minimum multiplexing period of the electronic system.

By including both the bidirectional clamp and the pair of protection transistors, low-leakage protection from excessive differential input voltage is realized. Thus, the amplifier exhibits low input-leakage current, facilitating the use of the amplifier in leakage sensitive applications including, but not limited to, multiplexed systems, sensor systems, and/or instrumentation.

In certain implementations, the pair of protection transistors each include a control input biased by a voltage source providing a common bias voltage to the pair of protection transistors. In one example, the pair of input transistors can receive a bias current from a current source at a tail node, and the voltage source is connected between the tail node and a common bias node to the pair of protection transistors. In another example, a common-bias control circuit (for instance, an extremum input selector) is used to generate a voltage related to the extremum voltage at the control inputs to the pair of input transistors, and the voltage source is connected between an output of the common-bias control circuit and the common bias node. For example, the extremum input selector can correspond to a minimum input selector when the input transistors are p-type, and to a maximum input selector when the input transistors are n-type.

Such biasing of the protection transistors serves to dynamically adjust the transistor's impedance (for instance, channel resistance). For example, when the differential input voltage between the pair of input terminals is small, the protection transistors serve to pass the differential input voltage with low impedance (for instance, by operating in triode). However, as the voltage of one differential input terminal changes in response to overvoltage, the voltage difference between the input terminal and the corresponding protection transistor's control input leads to a change in biasing and corresponding increase in the impedance of the protection transistor. Accordingly, both the differential input voltage applied to the control inputs of the input transistors and a flow of input current is limited.

Accordingly, the benefit of low input impedance is realized during normal operation of the amplifier, while the protection transistors are biased to provide high impedance to limit input current and provide protection when overvoltage conditions are present. In contrast, an amplifier that includes fixed series resistors for limiting input current suffers from input noise arising from the presence of the series resistors during normal operation.

The transistors can be implemented in a wide variety of ways. In certain implementations, the pair of input transistors and the pair of protection transistors correspond to field-effect transistors (FETs), such as metal-oxide-semiconductor (MOS) transistors. In such implementations, the control inputs correspond to transistor gates. MOS transistors can be associated with a wide variety of manufacturing processes including not only bulk complementary MOS (CMOS) processes, but also triple well CMOS processes, silicon on insulator (SOI) processes, double-diffused MOS (DMOS) processes, as well as a wide range of other manufacturing processes.

In certain implementations, the pair of input transistors and the pair of protection transistors have complementary device polarities. In a first example, the pair of protection transistors are n-type (for instance, n-type MOS or NMOS transistors, such as n-type DMOS transistors) and the pair of input transistors are p-type (for instance, p-type MOS or PMOS transistors, such as p-type DMOS transistors). In a second example, the pair of protection transistors are p-type (for instance, PMOS transistors, such as p-type DMOS transistors) and the pair of input transistors are n-type (for instance, NMOS transistors, such as n-type DMOS transistors).

The bidirectional clamp can be implemented in a wide variety of ways. In one example, a pair of anti-parallel diodes is connected between the control inputs of the pair of input transistors, thereby providing bidirectional clamping to limit the maximum voltage differences between the control inputs. The clamping voltage from a first input transistor control input to a second input transistor control input need not equal the clamping voltage from the second input transistor control input to the first input transistor control input. That is, the clamping voltages can be asymmetric. Examples of diodes for clamping include p-n junction diodes, Zener diodes, and Schottky diodes. Furthermore, to aid in setting desired clamp voltages for clamping (for instance, based on application and/or operating environment), two or more diodes (of the same or different type) can be included in series. Moreover, bidirectional clamps without diodes or using a combination of diodes and other components can also be used. In certain implementations, the bidirectional clamp is adjustable and/or controllable using metal options, bypass switches, and/or other control structures. A bidirectional clamp is also referred to herein as a bidirectional voltage clamp.

When the input transistors are implemented as MOS transistors, the bidirectional clamp serves to limit large gate-to-source voltage and/or large gate-to-drain voltage conditions to inhibit gate oxide damage.

In certain implementations, the amplifier input circuitry is included in an input stage of an amplifier. Additionally, the amplifier can include one more additional stages, for instance, a cascade of the input stage with one or more additional stages.

FIG. 1 is a schematic diagram of amplifier input circuitry 10 according to one embodiment. The amplifier input circuitry 10 includes a first input transistor 2a and a second input transistor 2b arranged as a differential pair 1. The amplifier input circuitry 10 further includes a first protection transistor 3a, a second protection transistor 3b, a current source 4, a voltage source 5, and a bidirectional clamp 6. The amplifier input circuitry 10 further includes a pair of input terminals including a non-inverting input terminal IN+ and an inverting input terminal IN−.

The amplifier input circuitry 10 can be included in an amplifier, for instance, in the amplifier's input stage. Thus, the differential pair 1 can correspond to a differential pair of the amplifier, and the pair of input terminals can correspond to the amplifier's differential input terminals. Amplifier input circuitry, such as the amplifier input circuitry 10 of FIG. 1, is also referred to herein as a protected differential pair.

As shown in FIG. 1, the first protection transistor 3a is connected in series between the non-inverting input terminal IN+ and a control input of the first input transistor 2a. Additionally, the second protection transistor 3b is connected in series between the inverting input terminal IN− and a control input of the second input transistor 2b. Furthermore, the bidirectional clamp 6 is connected between the control input of the first input transistor 2a and the control input of the second input transistor 2b.

The current source 4 serves to provide a bias current to a tail node of the differential pair 1. The differential pair 1 serves to generate a differential output signal including a non-inverted signal component OUT+ and an inverted signal component OUT−. The differential output signal can be provided to other circuitry of an amplifier, for instance, a load of an input stage. In certain implementations, one or more cascode transistors are included in series with each of the input transistors.

In the illustrated embodiment, the voltage source 5 is connected between the tail node of the differential pair 1 and a common bias node that biases a control input of the first protection transistor 3a and a control input of the second protection transistor 3b. Although one embodiment of biasing the protection transistors 3a-3b is shown, the teachings herein are applicable to input protection circuitry in which the protection transistors are biased in other ways. For example, in another embodiment, a common-mode voltage of the control inputs of the differential pair 1 (or an extremum voltage of the control inputs) is detected and used to generate a bias voltage for the protection transistors 3a-3b. In yet another embodiment, the voltage source 5 is in series with the current source 4.

By including both the bidirectional clamp 6 and the protection transistors 3a-3b, low-leakage protection from excessive differential input voltage is realized. In particular, the amplifier input circuitry 10 includes the protection transistors 3a-3b to limit input current, while the bidirectional clamp 6 limits a maximum differential voltage across the control inputs of the differential pair 1 to provide fail-safe if the protection transistors 3a-3b are not sufficient to fully protect the inputs. Thus, the amplifier input circuitry 10 exhibits low input-leakage current, facilitating the use of the amplifier input circuitry 10 in leakage sensitive applications.

In the illustrated embodiment, the protection transistors 3a-3b operate with dynamic bias to adjust the transistor's impedance (for instance, channel resistance). For example, when the differential input voltage between the input terminals (IN+, IN−) is small, the protection transistors 3a-3b serve to pass the differential input voltage with low impedance (for instance, by operating in triode). However, as the voltage of one differential input terminal changes in response to overvoltage, the voltage difference between the input terminal and the corresponding protection transistor's control input leads to a change in biasing and corresponding increase in the impedance of the protection transistor. Accordingly, both the differential input voltage across the control inputs of the differential pair 1 and a flow of input current to the differential pair 1 is limited.

Accordingly, the benefits of low input impedance (for instance, low noise) are realized during normal operation, while the protection transistors 3a-3b are biased to provide high impedance to limit input current and provide protection when overvoltage conditions are present.

Figure 2:
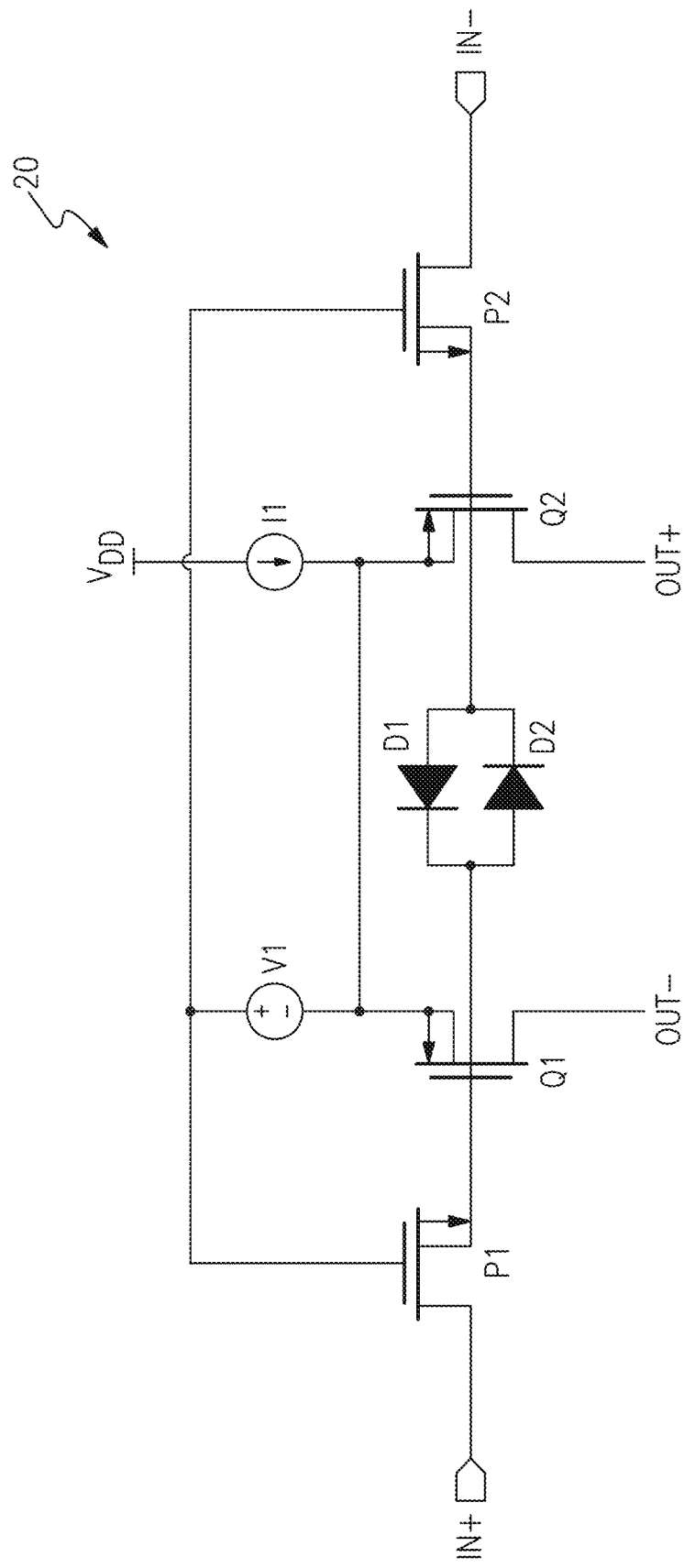
FIG. 2 is a schematic diagram of amplifier input circuitry according to another embodiment.

FIG. 2 is a schematic diagram of amplifier input circuitry 20 according to another embodiment. The amplifier input circuitry 20 includes a first input p-type field-effect transistor (PFET) Q1, a second input PFET Q2, a first protection n-type field-effect transistor (NFET) P1, a second protection NFET P2, a voltage source V1, a current source I1, and a bidirectional clamp including anti-parallel diode pair D1 and D2. The amplifier input circuitry 20 further includes a pair of input terminals including a non-inverting input terminal IN+ and an inverting input terminal IN−.

The amplifier input circuitry 20 of FIG. 2 is similar to the amplifier input circuitry 10 of FIG. 1, except that the amplifier input circuitry 20 of FIG. 2 illustrates specific implementations of certain components, such as the bidirectional clamp, the protection transistors, and the input transistors.

In the illustrated embodiment, the first protection NFET P1 includes a drain connected to the non-inverting input terminal IN+, a gate that receives a bias voltage from the voltage source V1, and a source and body connected to a gate of the first input PFET Q1. Additionally, the second protection NFET P2 includes a drain connected to the inverting input terminal IN−, a gate that receives the bias voltage from the voltage source V1, and a source and a body connected to a gate of the second input PFET Q2. Furthermore, a source and a body of the first input PFET Q1 are connected to a source and a body of the second input PFET Q2 at a tail node of the differential pair. A drain of the first input PFET Q1 outputs an inverted output signal component OUT− while a drain of the second input PFET Q2 outputs a non-inverted output signal component OUT+. The current source I1 is connected between a power supply voltage $V_{DD}$ and the tail node, and serves to generate a bias current for the first input PFET Q1 and the second input PFET Q2. The voltage source V1 is connected between the tail node and a common bias node for the gates of the first protection NFET P1 and the second protection NFET P2.

With continuing reference to FIG. 2, the first clamping diode D1 includes an anode connected to the gate of the second input PFET Q2 and a cathode connected to the gate of the first input PFET Q1. The second clamping diode D2 includes an anode connected to the gate of the first input PFET Q1 and a cathode connected to the gate of the second input PFET Q2. The first clamping diode D1 and the second clamping diode D2 serve as a bidirectional clamp that limits a maximum differential voltage across the gates of the first input PFET Q1 and the second input PFET Q2.

The first protection NFET P1 and the second protection NFET P2 serve to limit input current. In particular, when the differential input voltage between the input terminals (IN+, IN−) is small, the first protection NFET P1 and the second protection NFET P2 operate in triode to provide low channel resistance. However, as the voltage of one differential input terminal rises (for instance, IN+ increases), the voltage of the corresponding input transistor gate increases (for instance, the gate of Q1), and the voltage difference between the gate of the input transistor (for instance, Q1) and the gate of the corresponding protection transistor (for instance, NFET P1) leads to a reduction in gate-to-source bias voltage and corresponding increase in channel resistance. Accordingly, in response to an excursion of one of the differential input terminals, the channel resistance of a corresponding protection transistor increases. The increase in resistance causes an increase in voltage drop across the protection transistor. Accordingly, both the differential input voltage across the control inputs of the differential pair and a flow of input current to the differential pair is limited.

Biasing the first protection NFET P1 and the second protection NFET P2 in this manner provides the benefit of low input resistance (and thus, low noise) during normal operation, while dynamically adjusting bias to limit input current when a large differential input voltage is present.

Figure 3:
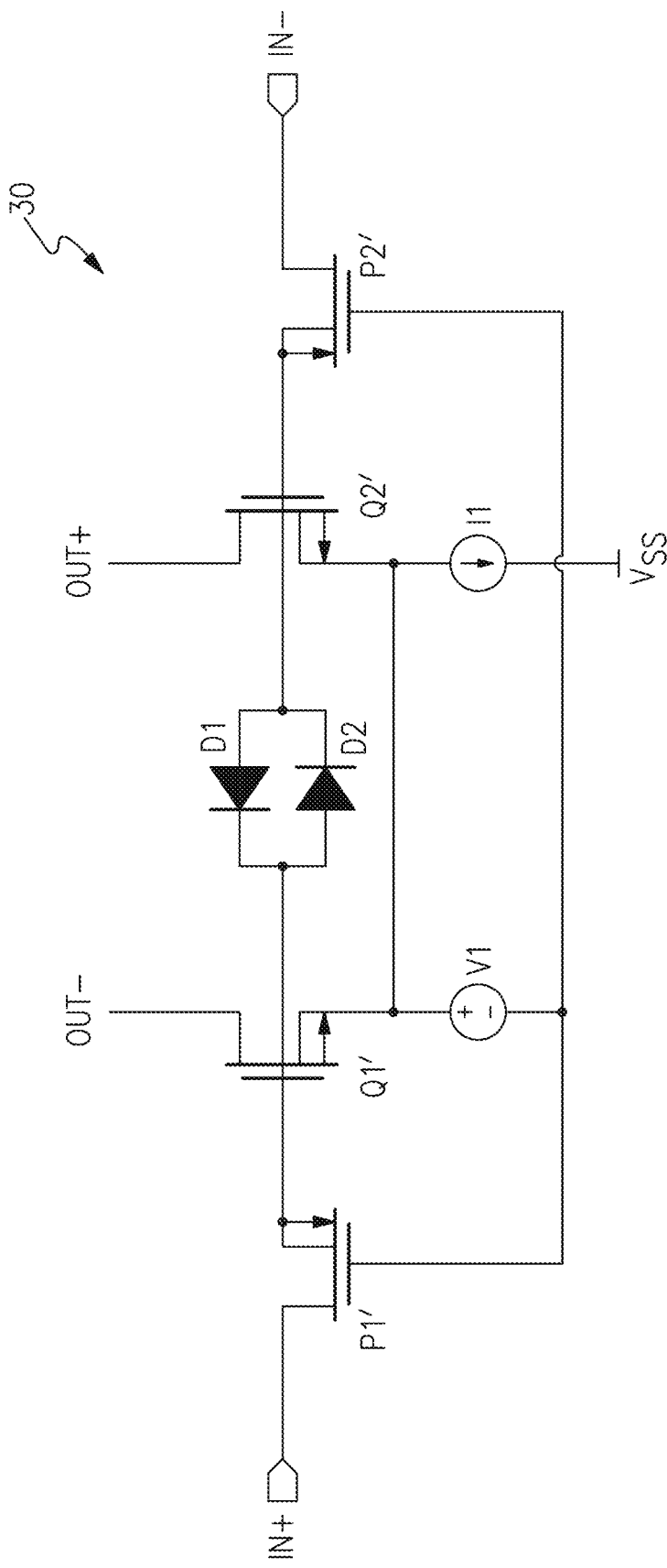
FIG. 3 is a schematic diagram of amplifier input circuitry according to another embodiment.

FIG. 3 is a schematic diagram of amplifier input circuitry 30 according to another embodiment. The amplifier input circuitry 30 includes a first input NFET Q1', a second input NFET Q2', a first protection PFET P1', a second protection PFET P2', a voltage source V1, a current source I1, and a bidirectional clamp including anti-parallel diode pair D1 and D2. The amplifier input circuitry 30 further includes a pair of input terminals including a non-inverting input terminal IN+ and an inverting input terminal IN−.

The amplifier input circuitry 30 of FIG. 3 is similar to the amplifier input circuitry 20 of FIG. 2, except that the amplifier input circuitry 30 of FIG. 3 uses an opposite configuration of device polarity. In particular, the amplifier input circuitry 30 of FIG. 3 includes n-type input transistors and p-type protection transistors, while the amplifier input circuitry 20 of FIG. 2 includes p-type input transistors and n-type protection transistors.

The amplifier input circuitry 30 is suitable for applications protecting from overstress of negative polarity. For example, a channel resistance of the first protection PFET P1' increases in response to negative polarity overstress at the non-inverting input terminal IN+, while a channel resistance of the second protection PFET P2' increases in response to negative polarity overstress at the inverting input terminal IN−. Accordingly, in response to an excursion of one of the differential input terminals, the channel resistance of a corresponding protection transistor increases.

The teachings herein are applicable to a wide variety of transistor types and polarities. For example, any of the embodiments herein can be implemented using an n-type input transistor pair or a p-type input transistor pair.

In the illustrated embodiment, the first protection PFET P1' includes a drain connected to the non-inverting input terminal IN+, a gate that receives a bias voltage from the voltage source V1, and a source and body connected to a gate of the first input NFET Q1'. Additionally, the second protection PFET P2' includes a drain connected to the inverting input terminal IN−, a gate that receives the bias voltage from the voltage source V1, and a source and a body connected to a gate of the second input NFET Q2'. Furthermore, a source and a body of the first input NFET Q1' are connected to a source and a body of the second input NFET Q2' at a tail node of the differential pair. The drains of the first input NFET Q1' and the second input NFET Q2' output a differential output signal (OUT+, OUT−). The current source I1 is connected between a power low or ground voltage $V_{SS}$ and the tail node, and serves to generate a bias current for the first input NFET Q1' and the second input NFET Q2'. The voltage source V1 is connected between the tail node and a common bias node for the gates of the first protection PFET Q1' and the second protection PFET Q2'. The first clamping diode D1 includes an anode connected to the gate of the second input NFET Q2' and a cathode connected to the gate of the first input NFET Q1'. The second clamping diode D2 includes an anode connected to the gate of the first input NFET Q1' and a cathode connected to the gate of the second input NFET Q2'.

Figure 4:
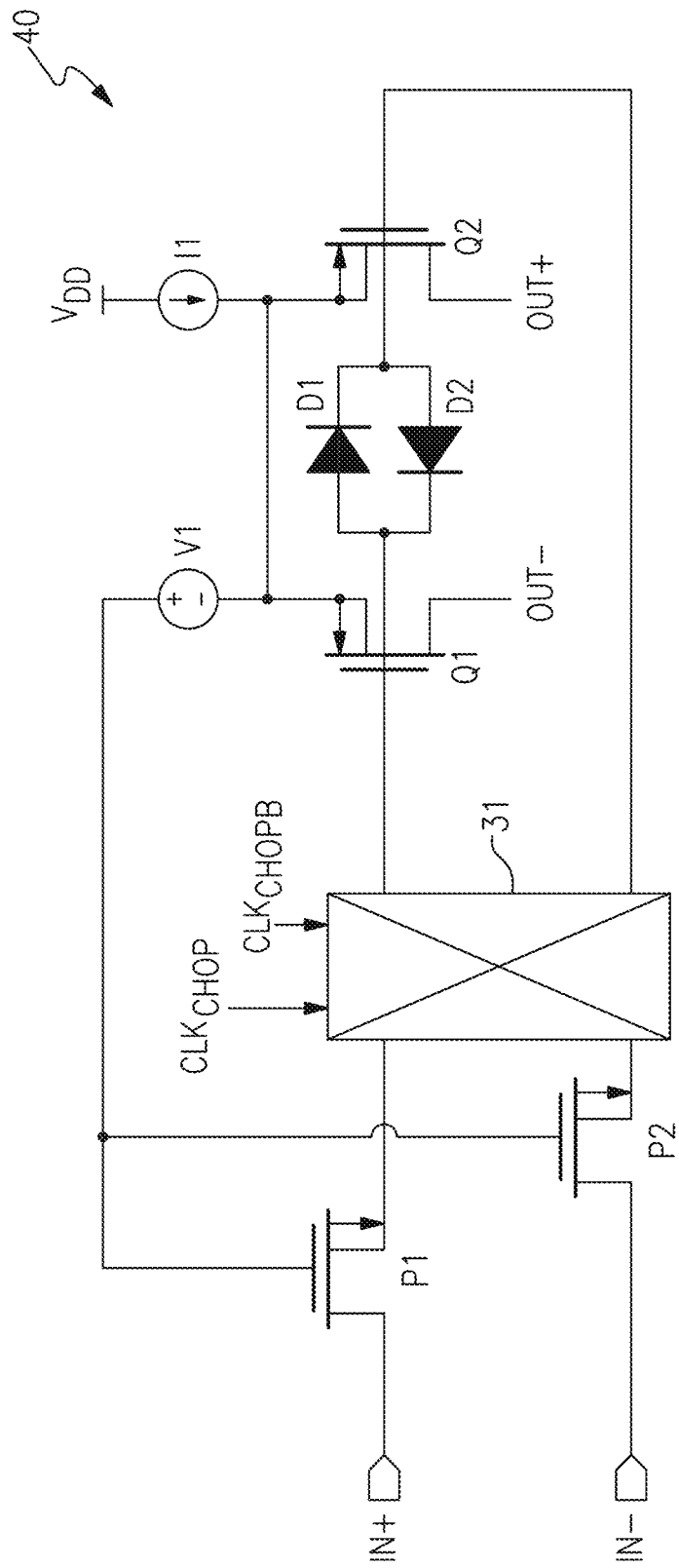
FIG. 4 is a schematic diagram of amplifier input circuitry according to another embodiment.

FIG. 4 is a schematic diagram of amplifier input circuitry 40 according to another embodiment. The amplifier input circuitry 40 includes a first input PFET Q1, a second input PFET Q2, a first protection NFET P1, a second protection NFET P2, a voltage source V1, a current source I1, input chopping switches 31, and a bidirectional clamp including a clamping diodes D1 and D2. The amplifier input circuitry 40 further includes a pair of input terminals including a non-inverting input terminal IN+ and an inverting input terminal IN−.

The amplifier input circuitry 40 of FIG. 4 is similar to the amplifier input circuitry 20 of FIG. 2, except that the amplifier input circuitry 40 of FIG. 4 further includes input chopping switches 31 controlled by a chopping clock signal $CLK_{CHOP}$ and an inverting chopping clock signal $CLK_{CHOPB}$, which is logically inverted relative to the chopping clock signal $CLK_{CHOP}$ (with or without non-overlap).

In certain implementations, the input chopping switches 31 include a first chopping NFET connected between the source of the first protection NFET P1 and the gate of the first input PFET Q1 and controlled by $CLK_{CHOP}$, a second chopping NFET connected between the source of the second protection NFET P2 and the gate of the second input PFET Q2 and controlled by $CLK_{CHOP}$, a third chopping NFET connected between the source of the first protection NFET P1 and the gate of the second input PFET Q2 and controlled by $CLK_{CHOPB}$, and a fourth chopping NFET connected between the source of the second protection NFET P2 and the gate of the first input PFET Q1 and controlled by $CLK_{CHOPB}$. However, other implementations are possible.

Implementing an amplifier with chopping compensates for an input offset voltage of the amplifier's differential pair. Although an example with chopping is depicted, other implementations of amplifier input offset voltage compensation are possible, including, but not limited to, auto-zeroing. Any of the amplifier input circuits herein can be implemented with chopping, auto-zeroing, and/or other input offset voltage compensation schemes.

Figure 5:
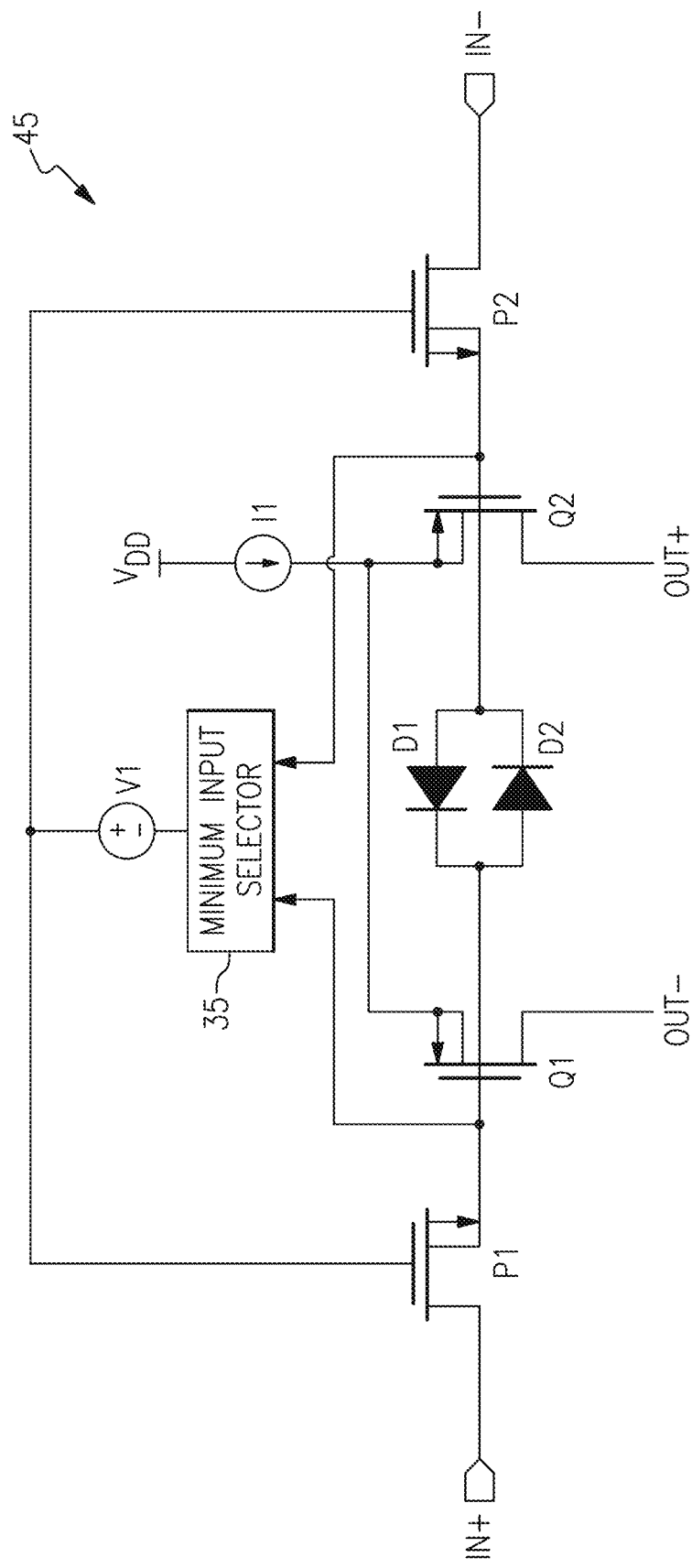
FIG. 5 is a schematic diagram of amplifier input circuitry according to another embodiment.

FIG. 5 is a schematic diagram of amplifier input circuitry 45 according to another embodiment. The amplifier input circuitry 45 includes a first input PFET Q1, a second input PFET Q2, a first protection NFET P1, a second protection NFET P2, a voltage source V1, a current source I1, a extremum input selector 35, and a bidirectional clamp including a clamping diodes D1 and D2. The amplifier input circuitry 45 further includes a pair of input terminals including a non-inverting input terminal IN+ and an inverting input terminal IN−.

The amplifier input circuitry 45 of FIG. 5 is similar to the amplifier input circuitry 20 of FIG. 2, except that the amplifier input circuitry 45 of FIG. 5 includes the extremum input selector 35 in series with the voltage source V1 to control a common bias voltage of the gates of the first protection NFET P1 and the second protection NFET P2. In particular, the extremum input selector 35 selects the lesser of the gate voltage of the first input PFET P1 and the gate voltage of the second input PFET P2, which is shifted by the voltage source V1 to generate the common bias voltage.

Figure 6A:
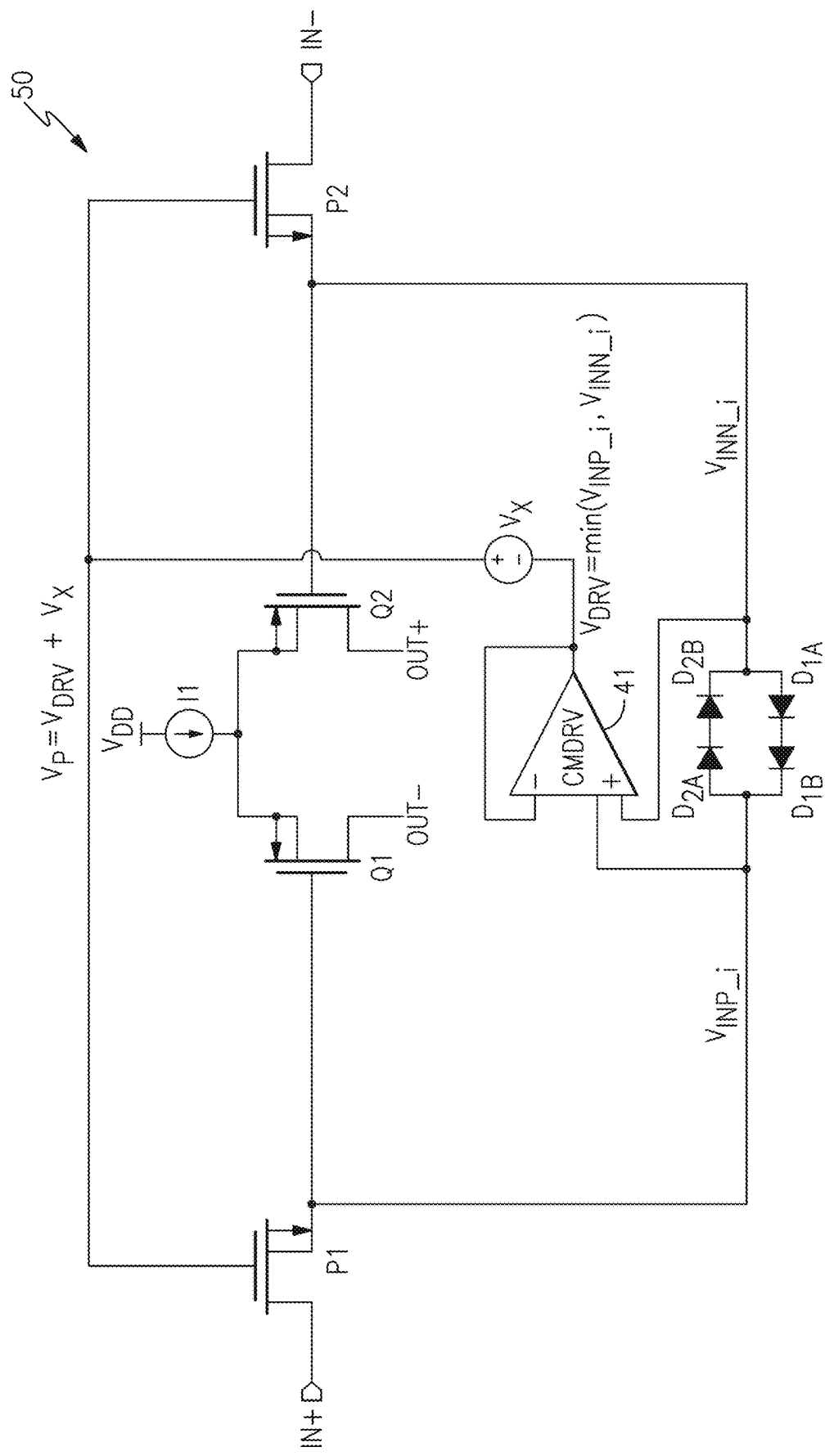
FIG. 6A is a schematic diagram of amplifier input circuitry according to another embodiment.

FIG. 6A is a schematic diagram of amplifier input circuitry 50 according to another embodiment. The amplifier input circuitry 50 includes a first input PFET Q1, a second input PFET Q2, a first protection NFET P1, a second protection NFET P2, and a current source I1, which are implemented in a manner similar to that of the amplifier input circuitry 20 of FIG. 2. However, in contrast to the amplifier input circuitry 20 of FIG. 2, the amplifier input circuitry 50 includes a different implementation of a bidirectional clamp and a different implementation of biasing the gates of the first protection NFET P1 and the second protection NFET P2.

For example, in the illustrated embodiment, the bidirectional clamp includes a first clamping diode $D_{1A}$ and a second clamping diode $D_{1B}$ connected in series from anode to cathode between the gate of the second input PFET Q2 and the gate of the first input PFET Q1. Additionally, the bidirectional clamp further includes a third clamping diode $D_{2A}$ and a fourth clamping diode $D_{2B}$ connected in series from anode to cathode between the gate of the first input PFET Q1 and the gate of the second input PFET Q2. Including multiple components in series can aid in achieving desired forward and reverse clamp voltages for clamping.

In certain implementations, the design of the bidirectional clamp is chosen to provide desired clamp voltages, which can be symmetrical or asymmetrical. Furthermore, in certain implementations, the bidirectional clamp is adjustable and/or controllable after manufacture to provide further flexibility. For example, in certain implementations, the number of clamping diodes in series in either or both clamping branches is selectable, for instance, based on back-end metal options, programming bypass switches (for instance, each in parallel with a diode), and/or other suitable configuration structures.

With continuing reference to FIG. 6A, the amplifier input circuitry 50 further includes a common-bias driver 41 (corresponding to a minimum input selector, in this example) and a voltage source $V_X$. The common-bias driver 41 serves to generate a driven output voltage $V_{DRV}$ related to the gate voltage of the first input PFET Q1 ($V_{INP\_i}$) and the gate voltage of the second input PFET Q2 ($V_{INN\_i}$), for instance, about equal to the minimum of $V_{INP\_i}$ and $V_{INN\_i}$. The voltage source $V_X$ is connected between the output of the common-bias driver 41 and a common bias node for the gates of the first protection NFET P1 and the second protection NFET P2. The voltage source $V_X$ biases with first protection NFET P1 and the second protection NFET P2 with a bias voltage $V_P$ about equal to a sum of $V_{DRV}$ and $V_X$.

Although another embodiment for biasing the gates of protection transistors is depicted, the teachings herein are applicable to a wide variety of biasing configurations for the protection transistors. Accordingly, other implementations are possible.

Figure 6B:
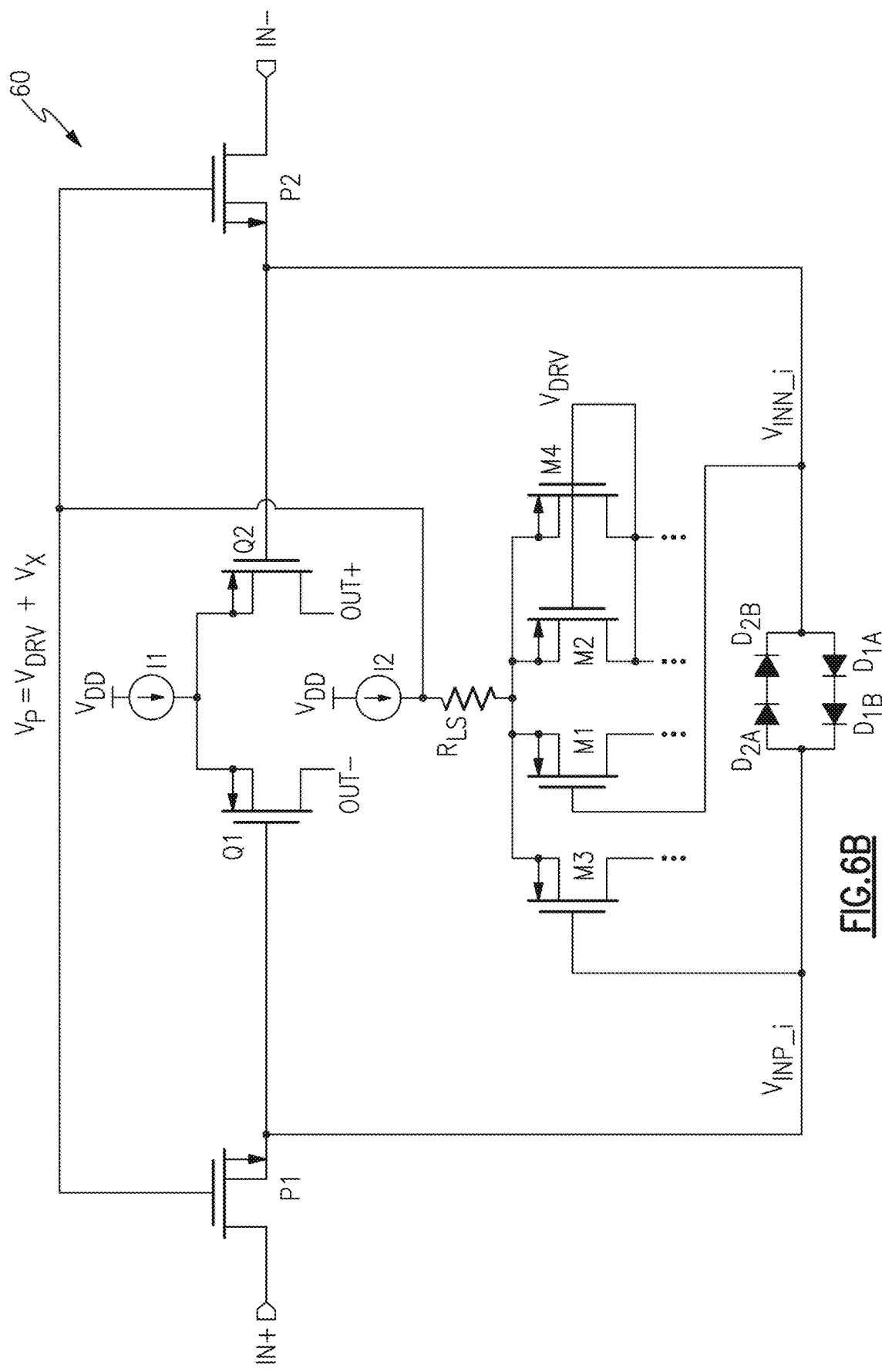
FIG. 6B is a schematic diagram of amplifier input circuitry according to another embodiment.

FIG. 6B is a schematic diagram of amplifier input circuitry 60 according to another embodiment. The amplifier input circuitry 60 includes a first input PFET Q1, a second input PFET Q2, a first protection NFET P1, a second protection NFET P2, a current source I1, a first clamping diode $D_{1A}$, a second clamping diode $D_{1B}$, a third clamping diode $D_{2A}$, and a fourth clamping diode $D_{2B}$, which are implemented in a manner similar to that of the amplifier input circuitry 50 of FIG. 6A. However, in comparison to the amplifier input circuitry 50 of FIG. 6A, the amplifier input circuitry 60 of FIG. 6B includes example circuitry for implementing the common-bias driver 41 and the voltage source $V_X$ of FIG. 6A.

For example, the amplifier input circuitry 50 depicts a first PFET M1, a second PFET M2, a third PFET M3, a fourth PFET M4, a load resistor $R_{LS}$, and a current source I2. Other circuitry for the common-bias driver has been omitted for clarity of the figure. As shown in FIG. 6B, negative feedback results in the gate voltages of the second PFET M2 and the fourth PFET M4 being about equal to $V_{DRV}$. Additionally, $V_{DRV}$ is shifted by a PFET gate-to-source voltage and a voltage drop across the load resistor $R_{LS}$ to generate $V_P$.

Although FIG. 6B depicts yet another embodiment for biasing the gates of protection transistors, the teachings herein are applicable to a wide variety of biasing configurations for the protection transistors. Accordingly, other implementations are possible.

Figure 7:
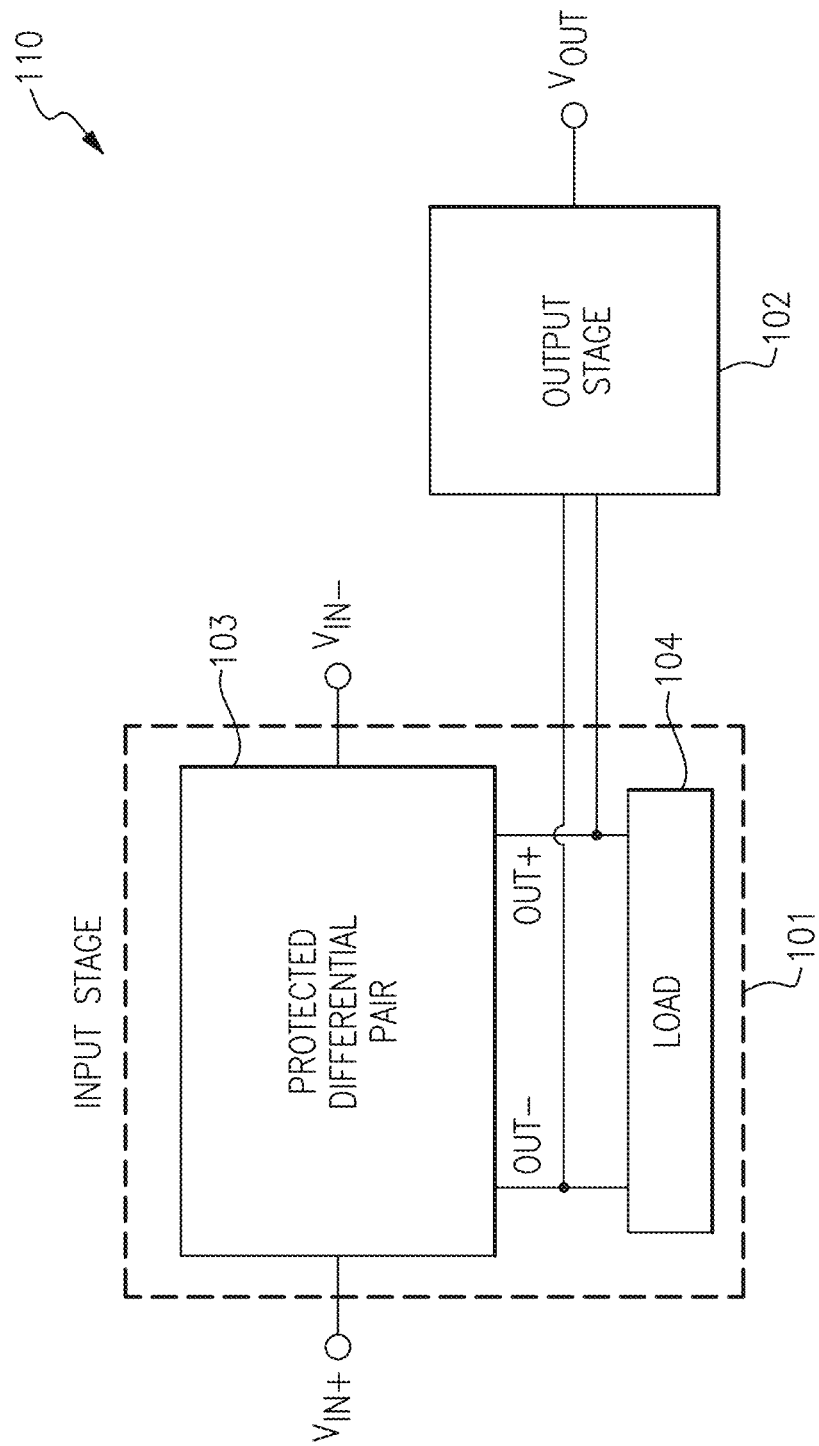
FIG. 7 is a schematic diagram of an amplifier according to one embodiment.

FIG. 7 is a schematic diagram of an amplifier 110 according to one embodiment. The amplifier 110 includes a pair of input voltage terminals ($V_{IN+}$, $V_{IN-}$), an input stage 101, an output stage 102, and an output voltage terminal $V_{OUT}$. The input stage 101 includes a protected differential pair 103 that drives a load 104. The protected differential pair 103 can be implemented in accordance with any of the embodiments herein.

Although one embodiment of an amplifier is depicted, the amplifier input circuitry herein can be incorporated into a wide variety of types of amplifiers. Such amplifier can include more or fewer stages, different types of stages, and/or terminals of other numbers and/or types. Accordingly, although a two-stage amplifier providing a single-ended output voltage is depicted, the teachings herein are applicable to amplifiers implemented in a wide variety of ways.

Figure 8:
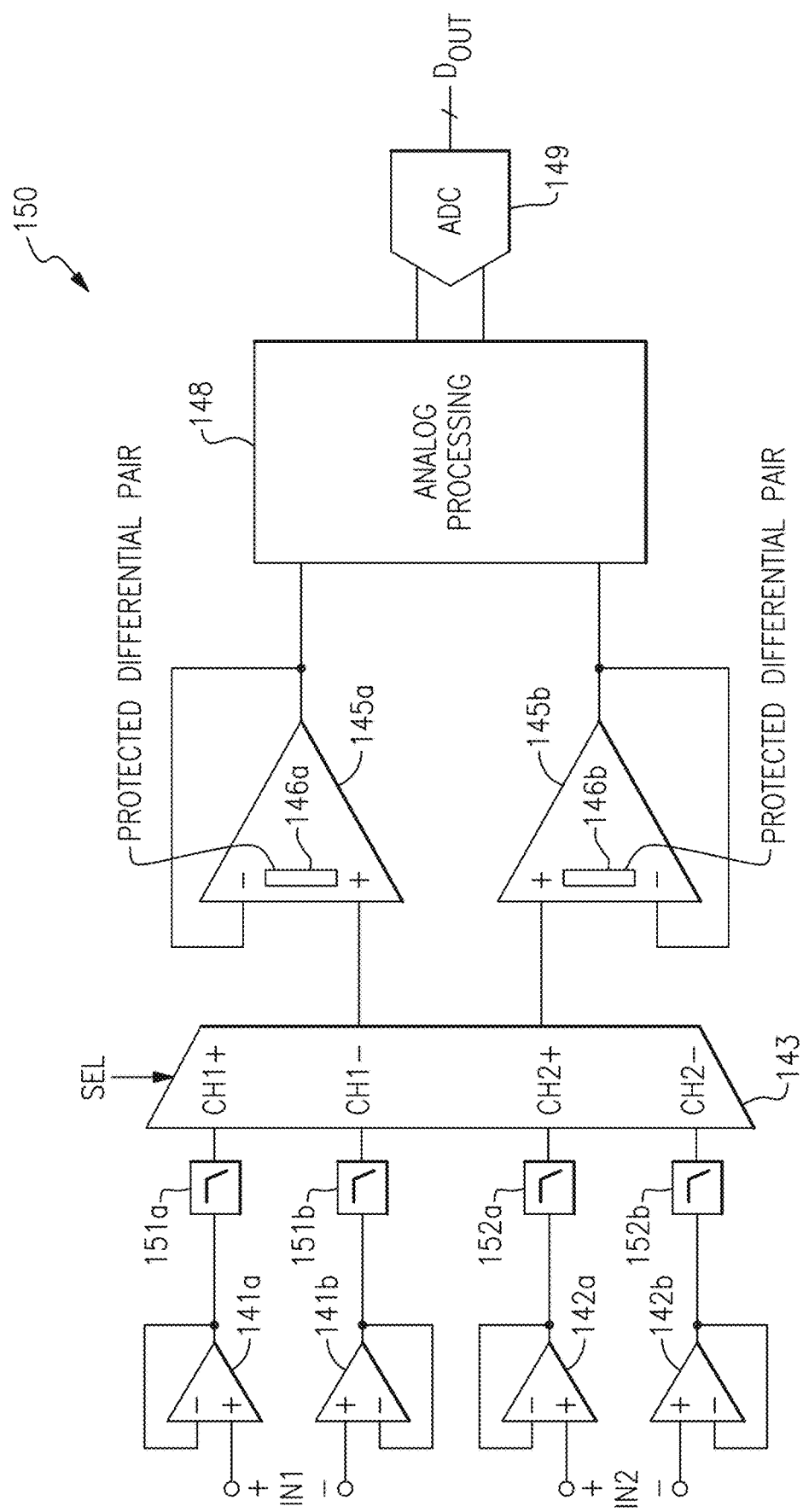
FIG. 8 is a schematic diagram of a multiplexed data acquisition system according to one embodiment.

FIG. 8 is a schematic diagram of a multiplexed data acquisition system 150 according to one embodiment. The multiplexed data acquisition system 150 includes a first pair of channel input terminals (IN1+, IN1−), a second pair of channel input terminals (IN2+, IN2−), a first pair of channel input buffers 141a-141b, a second pair of channel input buffers 142a-142b, a first pair of channel low pass filters 151a-151b, a second pair of channel low pass filters 152a-152b, a multiplexer 143 (receiving a select signal SEL), a first output buffer 145a, a second output buffer 145b, an analog processing circuit 148, and an analog-to-digital converter (ADC) 149 (which outputs a digital output signal Dour).

In the illustrated embodiment, the first output buffer 145a includes a first protected differential pair 146a and the second output buffer 145b includes a second protected differential pair 146b. The first protected differential pair 146a and the second protected differential pair 146b can be implemented in accordance with any of the embodiments herein.

The multiplexed data acquisition system 150 illustrates one embodiment of an electronic system utilizing amplifiers implemented in a muxing configuration, and which benefit from both overvoltage protection and input current limiting in accordance with the teachings herein.

For example, the non-inverting input terminal of first output buffer 145a is multiplexed to different input signals, and the first output buffer's inverting terminal is connected with feedback to the first output buffer's output terminal and remains near a previous voltage for some duration after the input signal is changed. Absent a protection mechanism, a large voltage difference develops between the first output buffer's input terminals when the input signal changes, and a flow of transient input current can arise.

Implementing the first output buffer 145a using the amplifier input circuitry herein provides a bidirectional clamp and protection transistors that operate in combination to prevent differential overvoltage and limit input current flow.

In contrast, when only a bidirectional clamp is included (when no pair of protection transistors is present), a change in input signal to the first output buffer 145a can result in a large current flowing from the non-inverting input terminal of the first output buffer 145a to the inverting input terminal, which causes a transient disturbance that can take considerable time to settle. The transient disturbance can lead to a degradation in accuracy and/or the minimum multiplexing period of the multiplexed data acquisition system 150.

By including both the bidirectional clamp and the pair of protection transistors, low-leakage protection from excessive differential input voltage is realized.

Although one embodiment of an electronic system including amplifiers implemented with protected differential pairs is depicted, the teachings herein are applicable to a wide variety of types of electronic systems. Accordingly, other implementations are possible.

Figure 9:
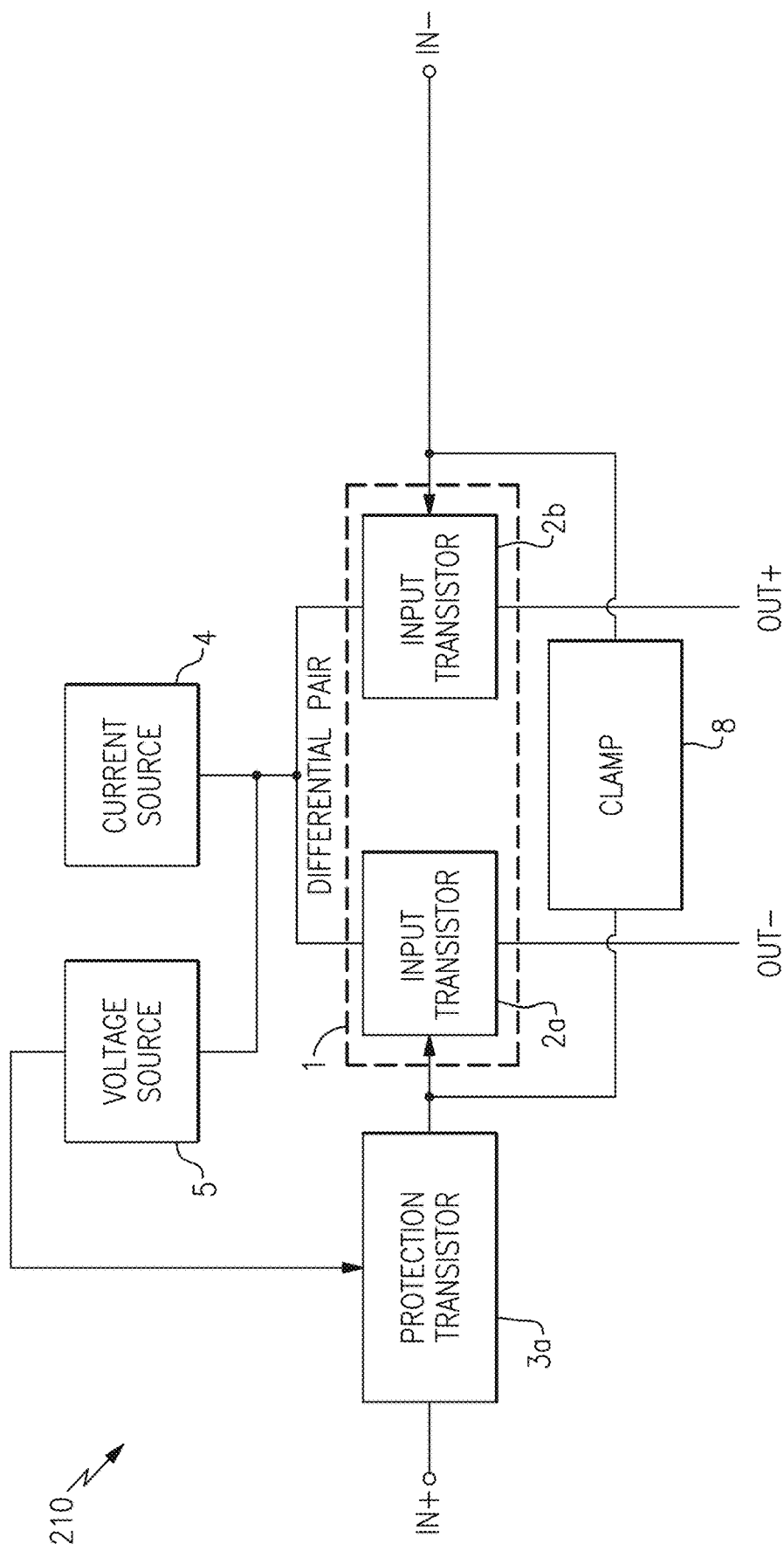
FIG. 9 is a schematic diagram of amplifier input circuitry according to another embodiment.

FIG. 9 is a schematic diagram of amplifier input circuitry 210 according to another embodiment. The amplifier input circuitry 210 includes a first input transistor 2a and a second input transistor 2b arranged as a differential pair 1. The amplifier input circuitry 210 further includes a first protection transistor 3a, a current source 4, a voltage source 5, and a clamp 8. The amplifier input circuitry 210 further includes a pair of input terminals including a non-inverting input terminal IN+ and an inverting input terminal IN−.

The amplifier input circuitry 210 of FIG. 9 is similar to the amplifier input circuitry 10 of FIG. 1, except that the amplifier input circuitry 210 of FIG. 9 omits the second protection transistor 3b, and also includes the clamp 8 rather than the bidirectional clamp 6.

In certain applications, only one of an amplifier's inputs is exposed to input overvoltage conditions. In such applications, the amplifier input circuitry can include protection circuitry for one input but not the other.

In the illustrated embodiment, the second protection transistor 3b of FIG. 1 has been omitted. Additionally, the bidirectional clamp 8 has been omitted in favor of including the clamp 6, which activates to provide clamping when a voltage difference between the control input of the first input transistor 2a and the control input of the second input transistor 2b is greater than a clamp voltage.

Although an example protecting the IN+ terminal but not the IN− is depicted, the teachings herein are also applicable to embodiments protecting the IN− terminal but not the IN+ terminal.

Figure 10:
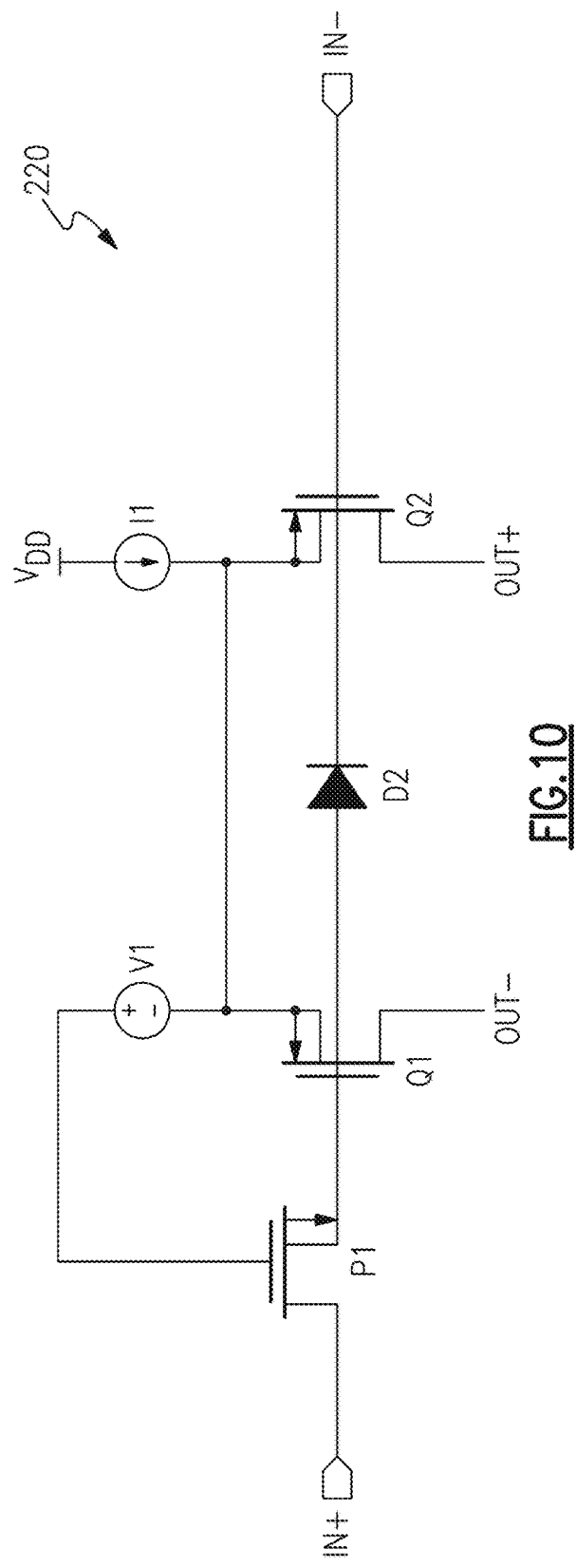
FIG. 10 is a schematic diagram of amplifier input circuitry according to another embodiment.

FIG. 10 is a schematic diagram of amplifier input circuitry 220 according to another embodiment. The amplifier input circuitry 220 includes a first input PFET Q1, a second input PFET Q2, a first protection NFET P1, a voltage source V1, a current source I1, and a clamp including diode D2. The amplifier input circuitry 220 further includes a pair of input terminals including a non-inverting input terminal IN+ and an inverting input terminal IN−.

The amplifier input circuitry 220 of FIG. 10 is similar to the amplifier input circuitry 20 of FIG. 2, except that the amplifier input circuitry 220 of FIG. 10 omits the second protection NFET P2 and the diode D1.

Figure 11:
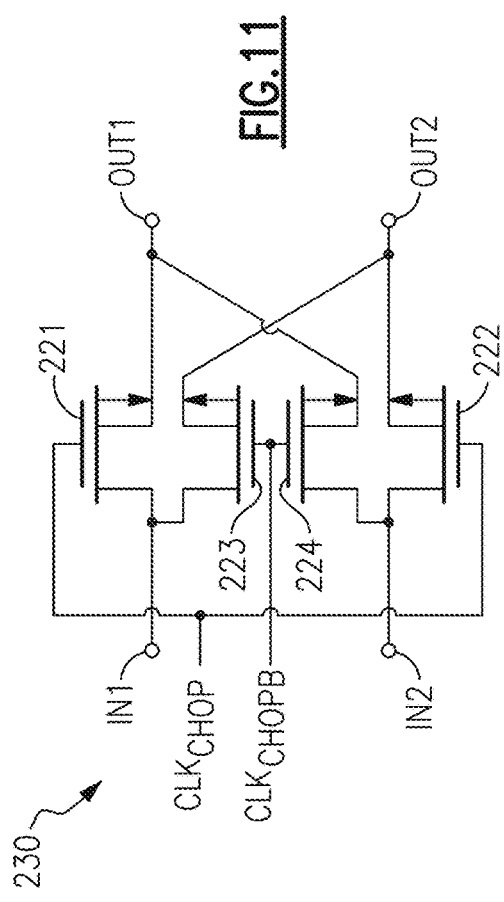
FIG. 11 is a schematic diagram of one example of chopping switches.

FIG. 11 is a schematic diagram of one example of chopping switches 230. The chopping switches 230 include a first chopping NFET 221 connected between a first input IN1 and a first output OUT1 and having a gate controlled by $CLK_{CHOP}$, a second chopping NFET 222 connected between a second input IN2 and a second output OUT2 and having a gate controlled by $CLK_{CHOP}$, a third chopping NFET 223 connected between the first input IN1 and the second output OUT2 and having a gate controlled by $CLK_{CHOPB}$, and a fourth chopping NFET 224 connected between the second input IN2 and the first output OUT1 and having a gate controlled by $CLK_{CHOPB}$.

The chopping switches 230 illustrate one example of chopping circuitry suitable for inclusion in the amplifiers herein. However, other implementations of chopping switches are possible.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. An amplifier having input-overvoltage protection with low leakage current, the amplifier comprising:

a pair of input terminals configured to receive a differential input signal, wherein the pair of input terminals includes a first input terminal and a second input terminal;

a differential pair of input transistors configured to amplify the differential input signal, wherein the differential pair of input transistors includes a first input transistor and a second input transistor connected at a tail node;

a first protection transistor in series between the first input terminal and a control input of the first input transistor;

a voltage source connected between the tail node and a control input of the first protection transistor;

a current source configured to generate a bias current, the current source including a first terminal directly connected to the tail node; and a voltage clamp configured to provide clamping between the control input of the first input transistor and a control input of the second input transistor.

2. The amplifier of claim 1, wherein an impedance of the first protection transistor is configured to increase in response to an excursion of the first or second input terminal.

3. The amplifier of claim 1, further comprising a second protection transistor in series between the second input terminal and the control input of the second input transistor, wherein the voltage clamp is bidirectional.

4. The amplifier of claim 3, wherein the control input of the first protection transistor and a control input of the second protection transistor are biased by a common bias voltage from the voltage source.

5. The amplifier of claim 4, wherein the common bias voltage is configured to change based on at least one of a voltage of the control input of the first input transistor or a voltage of the control input of the second input transistor.

6. The amplifier of claim 3, wherein the first input transistor and the second input transistor are p-type metal-oxide-semiconductor (PMOS) transistors each having a gate corresponding to the control input, and the first protection transistor and the second protection transistor are n-type metal-oxide-semiconductor (NMOS) transistors.

7. The amplifier of claim 1, wherein the voltage clamp includes a first clamping circuit having a first terminal connected to the control input of the first input transistor and a second terminal connected to the control input of the second input transistor, and a second clamping circuit having a first terminal connected to the control input of the second input transistor and a second terminal connected to the control input of the first input transistor.

8. The amplifier of claim 7, wherein the first clamping circuit and the second clamping circuit each include at least one diode.

9. The amplifier of claim 1, further comprising input chopping switches interposed between the pair of input terminals and the differential pair of input transistors.

10. The amplifier of claim 1, wherein the amplifier includes an input stage in cascade with an output stage, wherein the input stage includes the differential pair of input transistors.

11. The amplifier of claim 1, wherein the voltage clamp comprises a first diode having an anode directly connected to the control input of the first input transistor and a cathode directly connected to the control input of the second input transistor.

12. The amplifier of claim 11, wherein the voltage clamp further comprises a second diode having an anode directly connected to the control input of the second input transistor and a cathode directly connected to the control input of the first input transistor.

13. The amplifier of claim 12, wherein the second diode comprises one of a p-n junction diode, a Zener diode, or a Schottky diode.

14. The amplifier of claim 11, wherein the first diode comprises one of a p-n junction diode, a Zener diode, or a Schottky diode.

15. The amplifier of claim 1, wherein the voltage clamp comprises at least one of a p-n junction diode, a Zener diode, or a Schottky diode connected between the control input of the first input transistor and the control input of the second input transistor.

16. A method of amplifier input-overvoltage protection with low leakage current, the method comprising:

receiving a differential input signal between a first input terminal and a second input terminal of an amplifier;

amplifying the differential input signal using a differential pair of input transistors of the amplifier, the differential pair of input transistors including a first input transistor and a second input transistor connected at a tail node; and protecting the differential pair of input transistors from overvoltage, including controlling an impedance between the first input terminal and a control input of the first input transistor using a first protection transistor, providing a bias voltage using a voltage source connected between the tail node and a control input of the first protection transistor, generating a bias current using a current source including a first terminal directly connected to the tail node, and providing clamping between the control input of the first input transistor and a control input of the second input transistor using a voltage clamp.

17. The method of claim 16, wherein controlling the impedance between the first input terminal and the control input of the first input transistor comprises increasing a channel resistance of the first protection transistor in response to an excursion in a voltage of the first or second input terminal.

18. The method of claim 16, further comprising controlling an impedance between the second input terminal and a control input of the second input transistor using a second protection transistor, and biasing a control input of the second protection transistor using the bias voltage.

19. The method of claim 18, further comprising changing a voltage level of the bias voltage based on at least one of a voltage of the control input of the first input transistor and a voltage of the control input of the second input transistor.

20. The method of claim 18, wherein the voltage clamp comprises at least one of a p-n junction diode, a Zener diode, or a Schottky diode connected between the control input of the first input transistor and the control input of the second input transistor.

* * * * *